(12) United States Patent
Arita et al.

(10) Patent No.: US 8,757,090 B2
(45) Date of Patent: *Jun. 24, 2014

(54) GAS SHOWER PLATE FOR PLASMA PROCESSING APPARATUS

(75) Inventors: Kiyoshi Arita, Fukuoka (JP); Akira Nakagawa, Saga (JP); Koji Kuga, Fukuoka (JP); Taiji Matano, Fukuoka (JP); Nobuhiro Sato, Fukuoka (JP)

(73) Assignee: Panasonic Corporation, Osaka (JP)

( * ) Notice: Subject to any disclaimer, the term of this patent is extended or adjusted under 35 U.S.C. 154(b) by 1847 days.

This patent is subject to a terminal disclaimer.

(21) Appl. No.: 11/887,771

(22) PCT Filed: Apr. 4, 2006

(86) PCT No.: PCT/JP2006/307521
§ 371 (c)(1),
(2), (4) Date: Oct. 3, 2007

(87) PCT Pub. No.: WO2006/107113
PCT Pub. Date: Oct. 12, 2006

(65) Prior Publication Data
US 2009/0145359 A1    Jun. 11, 2009

(30) Foreign Application Priority Data
Apr. 5, 2005 (JP) .................. 2005-108330

(51) Int. Cl.
C23C 16/455 (2006.01)
C23C 16/50 (2006.01)
(52) U.S. Cl.
USPC ............. 118/723 E; 118/715; 156/345.34; 156/345.47

(58) Field of Classification Search
USPC ............ 118/715, 723 E; 156/345.33, 345.34, 156/345.43, 345.47
See application file for complete search history.

(56) References Cited

U.S. PATENT DOCUMENTS 2,987,143 A * 6/1961 Fuchs et al. .................. 188/71.5
3,211,447 A * 10/1965 Kaase et al. .................. 269/153
(Continued)

FOREIGN PATENT DOCUMENTS

JP   11-111626   4/1999
JP   2002-231638   8/2002
(Continued)

OTHER PUBLICATIONS

International Search Report issued Nov. 8, 2006 in the International (PCT) Application of which the present application is the U.S. National Stage.

*Primary Examiner* — Jeffrie R Lund
(74) *Attorney, Agent, or Firm* — Wenderoth, Lind & Ponack, LLP

(57) ABSTRACT

In a plasma processing apparatus for generating a plasma in a plasma generation space between a lower electrode and an upper electrode so that a processing object mounted on the lower electrode is subjected to plasma processing, a plurality of cutout portions for absorption of strain caused by thermal expansion due to rapid temperature increases in the plasma processing are formed at an equal pitch in an outer edge portion of a gas shower plate included in the upper electrode. Thus, the gas shower plate can be prevented from being damaged by occurrence of cracks in the outer edge portion of the gas shower plate or the like.

6 Claims, 10 Drawing Sheets

(56) References Cited

U.S. PATENT DOCUMENTS

| | | | |
|---|---|---|---|
| 3,273,232 A * | 9/1966 | Royer | 228/119 |
| 5,180,467 A * | 1/1993 | Cook et al. | 156/345.34 |
| 5,273,588 A | 12/1993 | Foster et al. | |
| 5,882,411 A | 3/1999 | Zhao et al. | |
| 6,036,782 A | 3/2000 | Tanaka et al. | |
| 6,051,286 A | 4/2000 | Zhao et al. | |
| 6,086,710 A | 7/2000 | Miyashita et al. | |
| 6,364,957 B1 | 4/2002 | Schneider et al. | |
| 6,444,040 B1 * | 9/2002 | Herchen et al. | 118/715 |
| 6,942,753 B2 * | 9/2005 | Choi et al. | 156/345.34 |
| 2002/0195202 A1 * | 12/2002 | Arita et al. | 156/345.33 |
| 2004/0206305 A1 | 10/2004 | Choi et al. | |
| 2009/0145359 A1 * | 6/2009 | Arita et al. | 118/723 E |
| 2009/0266488 A1 * | 10/2009 | Arita et al. | 156/345.43 |
| 2010/0043711 A1 * | 2/2010 | Chow et al. | 118/726 |

FOREIGN PATENT DOCUMENTS

| | | |
|---|---|---|
| JP | 2003-7682 | 1/2003 |
| JP | 2003-282462 | 10/2003 |
| WO | WO 96/31997 | 10/1996 |
| WO | 2004/094693 | 11/2004 |

* cited by examiner

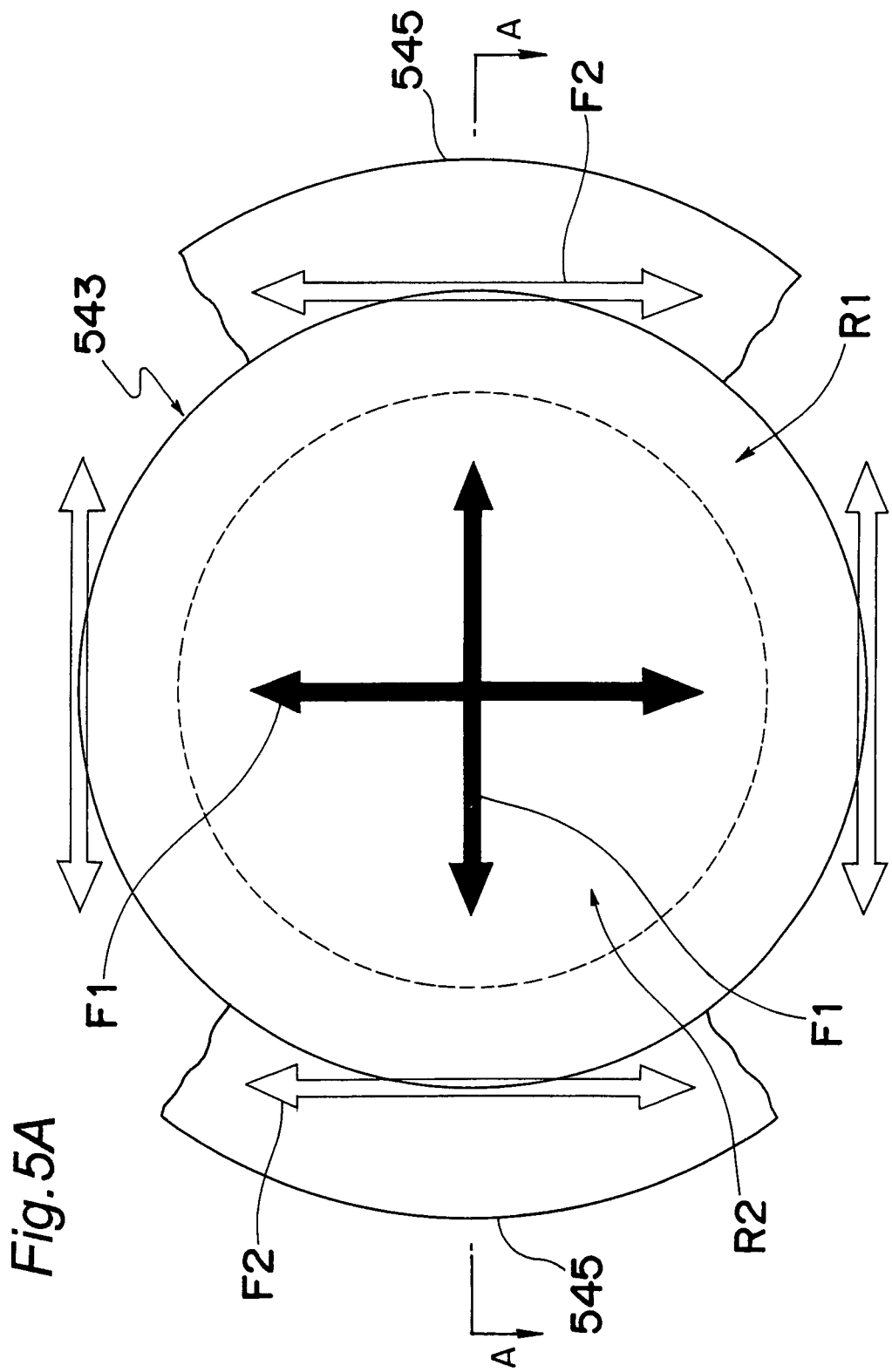

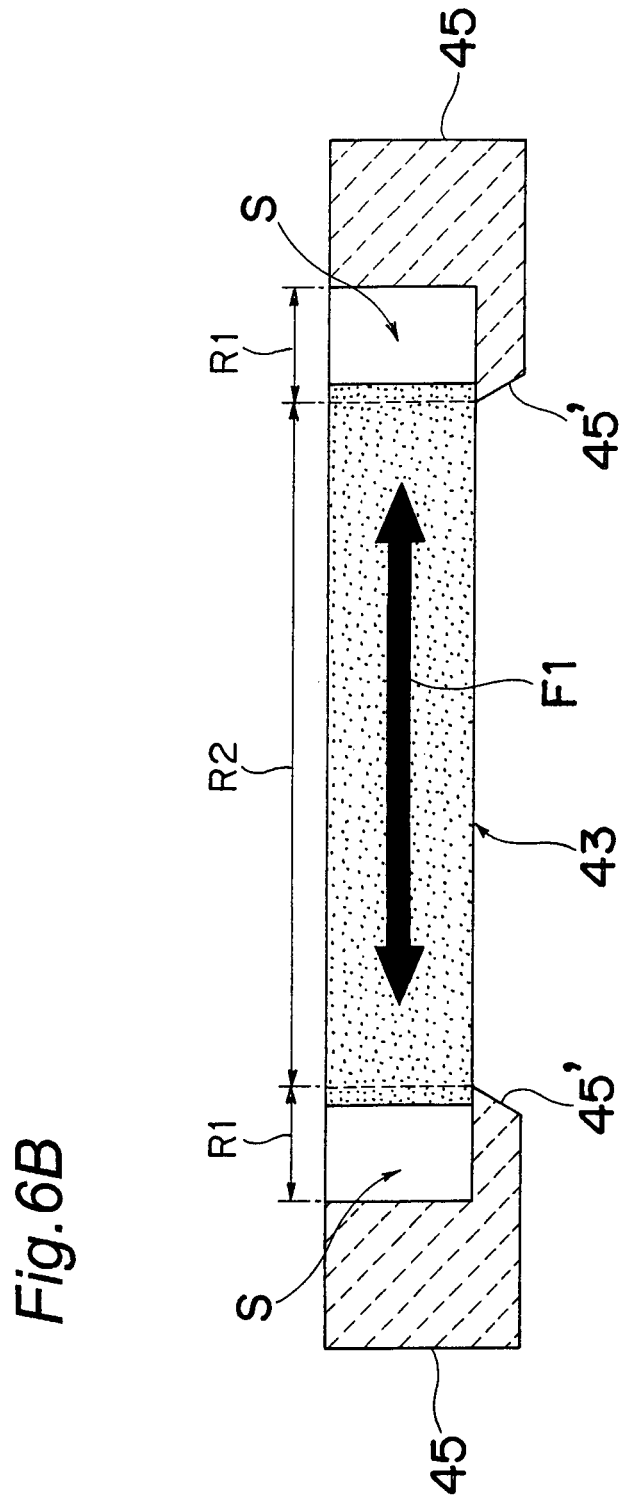

GAS SHOWER PLATE FOR PLASMA PROCESSING APPARATUS

BACKGROUND OF THE INVENTION

1. Technical Field

The present invention relates to a gas shower plate for use with plasma processing apparatuses, which is included in a plasma processing apparatus for performing plasma processing to a processing object such as a wafer or the like.

2. Description of the Related Art

As apparatuses for performing surface treatment of processing objects such as wafers or the like, there have been known plasma processing apparatuses. A plasma processing apparatus operates to produce plasma under a reduced-pressure atmosphere to allow a surface of a processing object to be subjected to etching processing or the like by physical and chemical actions of the plasma. Plasma is generated by applying a high-frequency voltage to an upper electrode or lower electrode while the internal pressure within a sealed processing chamber of the plasma processing apparatus is reduced to a specified pressure with a plasma-generation gas (hereinafter, referred to simply as 'gas') fed thereto.

For such plasma processing, it is desirable in some cases to generate high-density plasma depending on the aim of processing. For example, in plasma etching targeted for silicon substrates such as wafers or the like, a process of uniformly spraying and feeding a relatively high-pressure gas to a surface of a silicon wafer is used with a view to improving the processing efficiency.

Known gas shower plates which are parallel-plate electrode members suited for such plasma processing include a gas shower plate formed of a gas-permeable porous plate which is a sintered body of ceramic particles (see, e.g., Japanese unexamined patent publication No. 2002-231638 A, JP 2003-7682 A and JP 2003-282462 A). With the use of a gas shower plate formed as such a porous plate, it becomes possible to uniformly generate high-density plasma so that a stable plasma processing is carried out with high etching efficiency.

SUMMARY OF THE INVENTION

With a processing object set on the lower electrode within the processing chamber, as plasma processing is started by applying a high-frequency voltage to the upper electrode or lower electrode, the gas shower plate formed as a porous plate provided on one side closer to the upper electrode, which is a counter electrode to the lower electrode, rapidly increases in temperature. Whereas a porous plate typically has a diameter of about 220 mm or 320 mm and a thickness of about 2 to 10 mm, the gas shower plate does not increase in temperature uniformly as a whole, but does increase in temperature first rapidly in vicinities of a central portion of a counter surface (normally, lower surface) confronting the lower electrode (typically, rapidly increases from normal temperature to approximately 200° C. for about 30 seconds), and then increases in temperature gently at an outer edge portion of the gas shower plate more slowly than in the vicinities of the central portion. As a result, strain due to nonuniform temperature increases occurs to the gas shower plate, so that cracks might occur at the outer edge portion of the gas shower plate (for example, radial cracks occur to outer peripheral edge portions because the gas shower plate is generally a disc-shaped). This might cause the gas shower plate to be fractured and thus damaged, disadvantageously.

Accordingly, an object of the present invention, lying in solving the above problem, is to provide a gas shower plate for use with plasma processing apparatuses which gas shower plate can be prevented from damage due to occurrence of cracks caused by thermal expansion due to rapid temperature increases in plasma processing, thus allowing a stable plasma processing to be carried out.

According to a first aspect of the present invention, there is provided a gas shower plate for use with a plasma processing apparatus, for feeding out a plasma-generation gas supplied from a gas supply portion to a plasma processing space defined between an upper electrode and a lower electrode of the plasma processing apparatus, the shower plate comprising:

a porous plate having gas permeability, which is formed of a sintered body of ceramic particles, the plate having a plurality of cutout portions which are formed in an outer edge portion of the plate so as to extend through the plate in a thicknesswise direction thereof and which serve for absorption of thermal expansion of the plate.

According to a second aspect of the present invention, there is provided the gas shower plate for use with the plasma processing apparatus as defined in the first aspect, wherein the porous plate has a disc-like shape, the plate having a support region which is an annular region located in an outer edge portion of the disc-like shape and on which the plate is supported by the plasma processing apparatus, and a gas passage region which is a circular region located inside the outer edge portion of the disc-like shape and surrounded by the support region and in which the plasma-generation gas is allowed to pass therethrough, and each of the cutout portions is formed in the support region so as to be in close proximity to a boundary with the gas passage region.

According to a third aspect of the present invention, there is provided the gas shower plate for use with the plasma processing apparatus as defined in the first aspect, wherein the porous plate has a disc-like shape, and the individual cutout portions are formed at an equal pitch in an outer peripheral edge portion of the disk-like shape.

According to a fourth aspect of the present invention, there is provided the gas shower plate for use with the plasma processing apparatus as defined in the third aspect, wherein the cutout portions have identical sizes and shapes.

According to a fifth aspect of the present invention, there is provided the gas shower plate for use with the plasma processing apparatus as defined in the first aspect, wherein in each of the cutout portions, at least an inner circumferential surface on one side closer to a center of the porous plate is formed into a curved surface.

According to a sixth aspect of the present invention, there is provided the gas shower plate for use with the plasma processing apparatus as defined in the fifth aspect, wherein each of the cutout portions is formed so that an entirety of its inner circumferential surface becomes a curved surface.

According to a seventh aspect of the present invention, there is provided the gas shower plate for use with the plasma processing apparatus as defined in the first aspect, wherein each of the cutout portions has a slit-like shape.

According to the present invention, when plasma processing is started, the gas shower plate increases in temperature rapidly first in vicinities of its central portion, causing large temperature differences between its outer edge portion and vicinities of the central portion, so that strain due to temperature increases occurs, in particular, to the outer edge portion. Since such occurred strain can be absorbed by respective cutouts provided at the outer edge portion, the gas shower plate can be prevented from being damaged due to occurrence of cracks at the outer edge portion of the gas shower plate or other reasons.

BRIEF DESCRIPTION OF THE DRAWINGS

These and other aspects and features of the present invention will become clear from the following description taken in conjunction with the preferred embodiments thereof with reference to the accompanying drawings, in which:

FIG. 5A is a schematic plan view of a conventional gas shower plate;

FIG. 6B is a schematic sectional view taken along the line B-B in the gas shower plate of FIG. 6A;

DETAILED DESCRIPTION OF THE INVENTION

Figure 1:
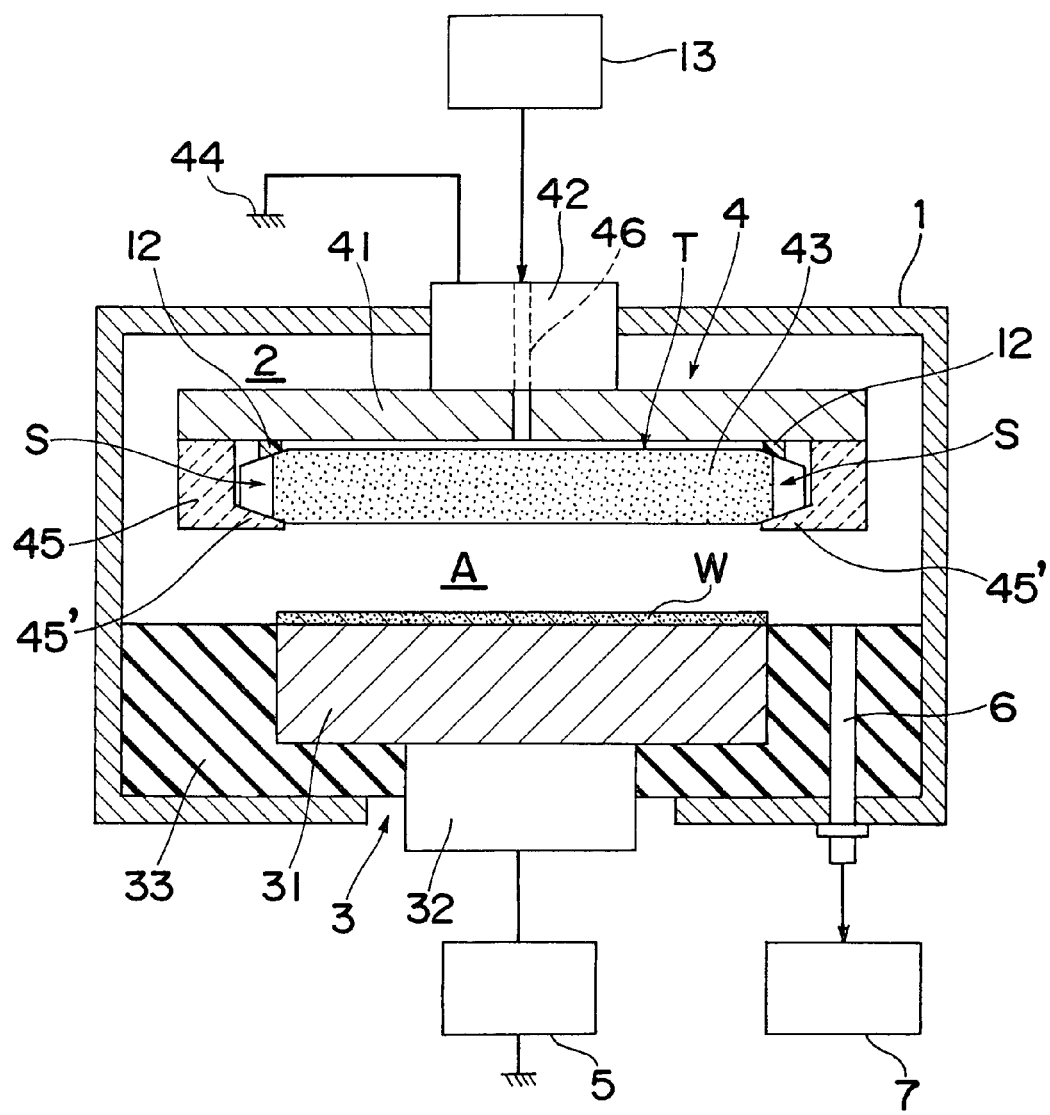
FIG. 1 is a sectional view of a plasma processing apparatus including a gas shower plate according to an embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

First, a plasma processing apparatus including a gas shower plate according to this embodiment is explained with reference to FIG. 1. Referring to FIG. 1, a vacuum chamber 1 internally has a processing chamber 2 for performing plasma processing, and a lower electrode 3 and an upper electrode 4 are placed in up-and-down opposition to each other inside the processing chamber 2, by which a parallel-plate type plasma processing apparatus is made up.

The lower electrode 3, which includes a stage 31 serving as a high-frequency electrode and a protruding portion 32 that protrudes downward from a central portion of the stage 31, is fitted inside the vacuum chamber 1 via an insulating member 33 provided around the outer edge portion of the stage 31. A high-frequency power supply unit 5 is electrically connected to the protruding portion 32 of the lower electrode 3. An exhaust passage 6 is formed at a side portion of the insulating member 33, serving for vacuum suction of the interior of the processing chamber 2 by exhaust unit 7 such as a vacuum pump. On the stage 31, a processing object W such as a wafer is to be mounted.

The upper electrode 4, which is the counter electrode, includes a flat plate (disc like plate)-shaped body portion 41, an annular support member 45 provided around a lower-surface outer peripheral portion of the body portion 41, and a gas shower plate 43 housed inside the support member 45 below the body portion 41. The upper electrode 4 is fitted to the vacuum chamber 1 via a protruding portion 42 that protrudes upward from a central portion of the body portion 41.

The gas shower plate 43 is a ceramic porous plate formed into a disc-like shape from a porous material which is formed from a sintered body of ceramic particles and which has gas permeability. More specifically, the gas shower plate 43, i.e. ceramic porous plate, has a three-dimensional mesh-like structure having ceramic skeletal portions formed continuously into a three-dimensional mesh and having a multiplicity of void portions (gaps) inside. Then, the individual void portions of this three-dimensional mesh-like structure are communicated with one another, and a multiplicity of irregular passages are formed so as to allow gas fed to one surface of the gas shower plate 43 to pass to the other surface.

For this ceramic porous material, ceramic foam is preferably used. The ceramic foam can be obtained by covering the surface of flexible urethane (polyurethane) foam, from which cell membranes have been removed, with ceramic slurry and thereafter firing the flexible urethane foam. Since the ceramic foam is high in void ratio and low in pressure loss even with its pore size very small, plasma can be dispersed more uniformly. Such ceramic foam is more preferably a material whose chemical components include 95 wt % or more of $Al_2O_3$ component and 2 wt % or less of $SiO_2$ component. Making a trace of $SiO_2$ contained in $Al_2O_3$ provides the ceramic foam optimized as electrode members excellent in thermal shock resistance. Then, the ceramic foam preferably has a bulk density of, preferably, 1.0 to 2.0 $g/cm^3$ and, more preferably, 1.2 to 1.8 $g/cm^3$, as well as a bending strength of 5 to 15 MPa. Less than 1.0 $g/cm^3$ bulk densities cause the skeleton portions to be so thin that the strength and the thermal shock resistance become insufficient, while more than 2.0 $g/cm^3$ bulk densities cause the pressure loss to become higher. Also, less than 5 MPa bending strengths cause the strength and the thermal shock resistance to become insufficient, while more than 15 MPa bending strengths cause the pressure loss to become higher, resulting in a poor dispersion of the plasma. It is noted that the terms 'bulk density' refers to a density expressed as mass (g)/volume ($cm^3$). As a method for measuring the volume, a test piece obtained by cutting the ceramic foam into a cubic or rectangular-parallelopiped form is prepared, and its outer dimensions (length, width, height) are measured by caliper square or other measuring instruments, where the volume can be calculated by resulting values of the measurement.

The support member 45 has such an annular shape so as to allow the gas shower plate 43 to be placed inside thereof and supported. Further, the support member 45 is further provided with a protruding portion (or annular support end portion) 45' that annularly protrudes inward (toward the central portion) from its inner wall lower portion. The gas shower plate 43 is housed in an internal space defined by the body portion 41 and the support member 45 with the outer edge portion (outer peripheral edge portion because the gas shower plate 43 of this embodiment is disc-shaped) entirely rested on the protruding portion 45'.

Figure 2:
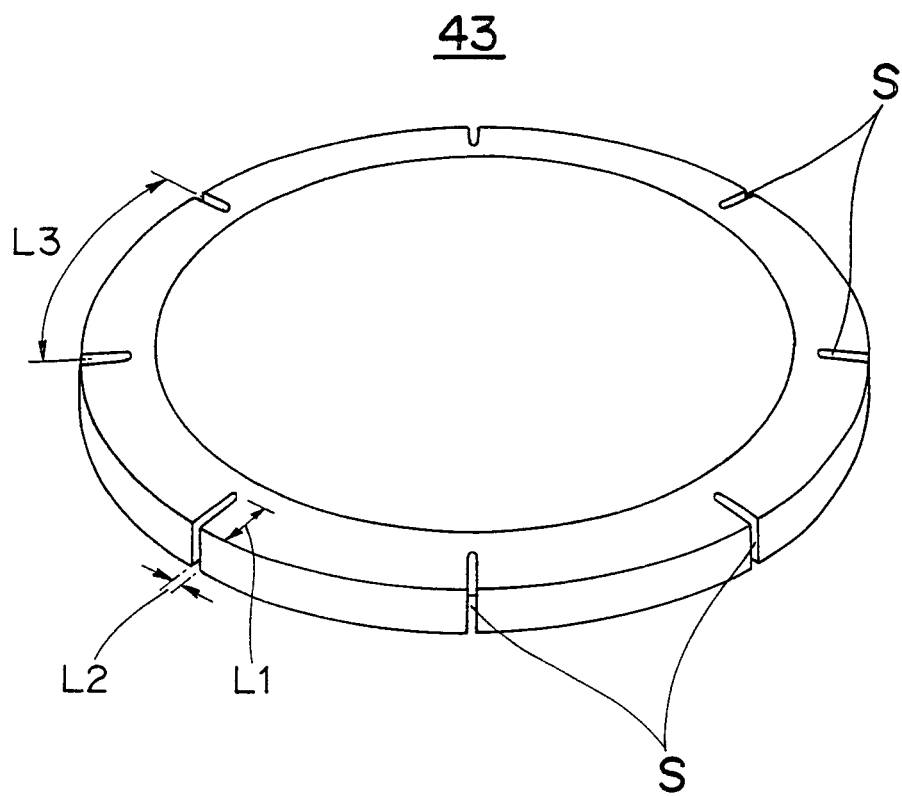
FIG. 2 is a perspective view of the gas shower plate of the embodiment.
Figure 3:
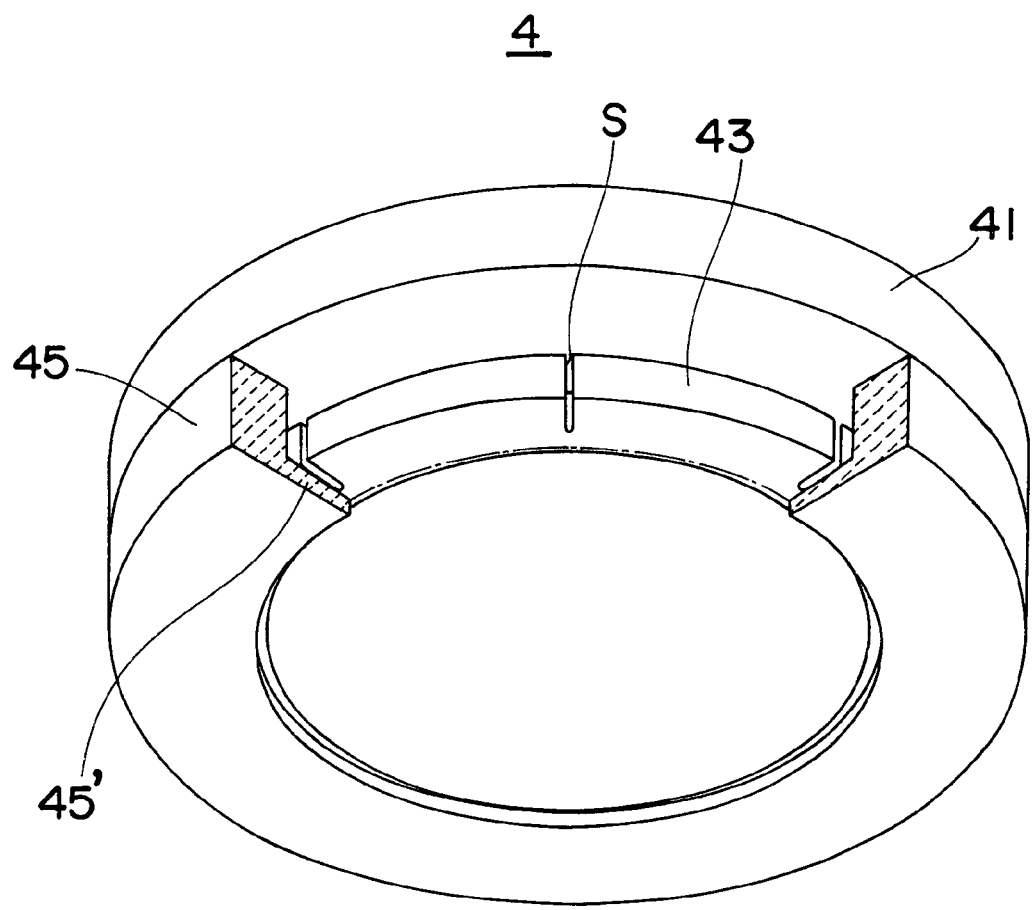
FIG. 3 is a perspective view (including a partly cut-out cross section) of a support member in which the gas shower plate is housed in the embodiment.

In FIGS. 2 and 3, the gas shower plate 43 provided on the upper electrode 4 side is disc-shaped, and slits S, which are an example of the cutout portions, are formed at specified intervals on its outer peripheral edge portion so as to extend thicknesswise (vertically) through the gas shower plate 43 with the radial direction of the gas shower plate 43 aligned with the longitudinal direction of the slits S. For example, in the case where the gas shower plate 43 has a diameter of about 220 mm or 320 mm, each slit S desirably has a length L1 of about 3 to 10 mm as well as a width L2 of about 0.5 mm to 1.0 mm, and moreover, desirably, the slits S are formed at an interval pitch L3 of 120 mm or less. It is noted that such a cutout portion can also be said to be a recess portion, as the gas shower plate 43 is seen along its radial direction.

Figure 4:
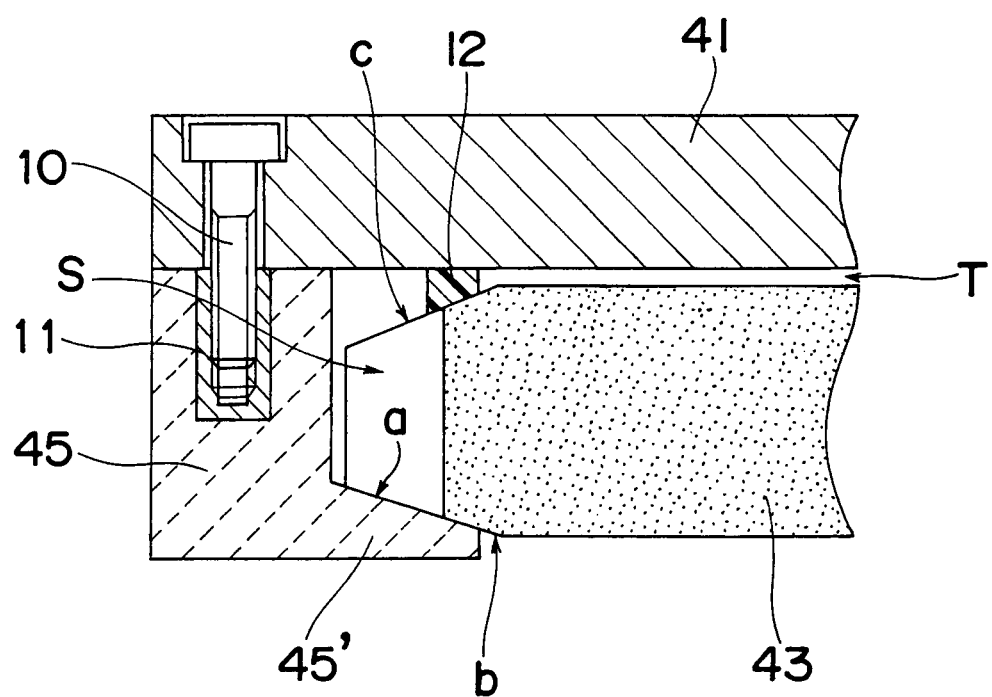
FIG. 4 is a partly enlarged sectional view of an upper electrode portion in the embodiment.

FIG. 4 shows a desirable connecting structure among the body portion 41, the support member 45 and the gas shower plate 43. The support member 45 is coupled to the body portion 41 by fittings such as bolts 10 or nuts 11. An upper surface "a" of the protruding portion 45' is a inwardly descending sloped tapered surface, and a lower surface "b" of the outer peripheral edge portion of the gas shower plate 43 is an outwardly ascending tapered surface, where the upper surface "a" and the lower surface "b" are joined together in close contact so as not to form any gap. Also, the protruding portion 45' extends inward (toward the central portion) more than the slits S, so that the slits S are closed at lower side thereof by the protruding portion 45'. As a result of this, a gas supply port T (described later) on the lower side of the body portion 41 is kept hermetic, so that a gas supplied to the gas supply port T is prevented from leaking to a plasma generation space A through the slits S. In addition, by the arrangement that the outer peripheral edge portion of the gas shower plate 43 and the protruding portion 45' of the support member 45 each have a tapered surface, the lower surface of the gas shower plate 43 and the lower surface of the support member 45 can be made generally flush with each other in height position in the state that the gas shower plate 43 is supported by the protruding portion 45', so that the discharge stability in plasma processing can be improved, compared with cases where no tapered surfaces are provided.

The upper surface of the gas shower plate 43 near the outer peripheral edge portion is an outwardly descending tapered surface "c", and a cushioning member 12 is provided between the tapered surface "c" and a portion of the body portion 41 near the outer peripheral edge portion of the gas shower plate 43. The cushioning member 12, which is made from an elastic material such as resin rubber, is ring-shaped as viewed in plan view, ensuring the hermeticity of the gas supply port (or a space for supplying the gas) T, which is a narrow gas flow space between the cushioning member 12 and a portion of the gas shower plate 43 on the lower surface side of the body portion 41.

In FIG. 1, in the body portion 41 and the protruding portion 42, a gas supply passage 46 is formed so as to vertically extend through those members. The body portion 41 is electrically grounded to a ground portion 44. The gas at the gas supply portion 13 is supplied through the gas supply passage 46 to the gas supply port T, passing inside the gas shower plate 43, so as to be supplied to the plasma generation space (plasma processing space) A between the lower electrode 3 and the upper electrode 4. Although the upper electrode 4 is electrically grounded in this embodiment, it is also possible that the lower electrode 3 is grounded while the upper electrode 4 is electrically connected to the high-frequency power supply.

This plasma processing apparatus having a structure described above, its operation is now explained. In a state that a processing object W such as a wafer is mounted on the stage 31, the exhaust unit 7 is activated to reduce the internal pressure of the processing chamber 2. Now that the interior of the processing chamber 2 has been reduced to a specified pressure, the gas is supplied from the gas supply portion 13 to the gas supply port T and let to pass through within the gas shower plate 43 so as to be fed out to the plasma generation space A between the two electrodes 3, 4. In this state, as a high-frequency voltage is applied to the lower electrode 3, plasma is generated in the plasma generation space A, where the processing object W is subjected to surface treatment such as plasma etching processing.

As the plasma processing is started as described above, the plasma generation space A rapidly increases in temperature, so that the gas shower plate 43 increases in temperature first rapidly in vicinities of the central portion of the counter surface (lower surface) of the gas shower plate 43 confronting the lower electrode 3. Because of thermal expansion due to this temperature increase, there occurs strain to the gas shower plate 43 especially at its outer peripheral edge portion. However, since the strain is absorbed by the slits S, no cracks, which may cause gas leakage, occur to the outer peripheral edge portion, so that a uniform, stable plasma processing is carried out.

Figure 5B:
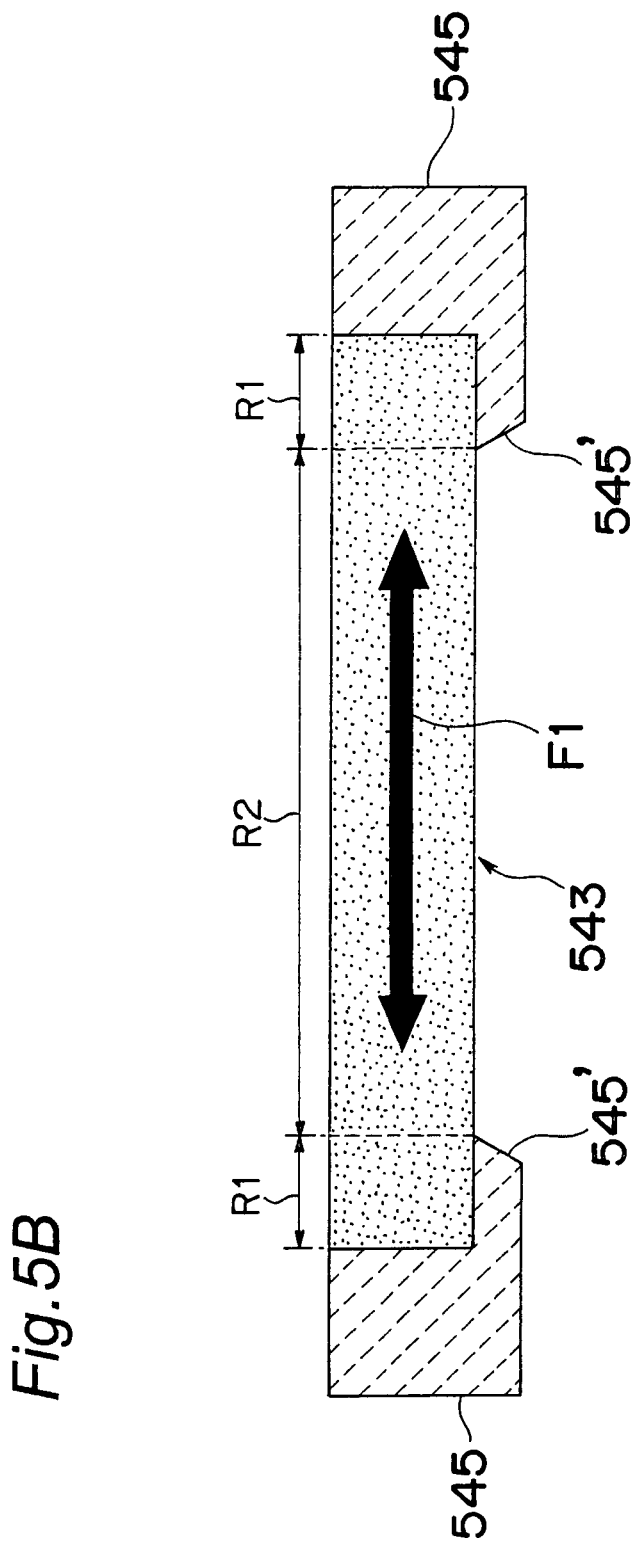
FIG. 5B is a schematic sectional view taken along the line A-A in the conventional gas shower plate of FIG. 5A.

Now the principle of absorption of strain due to thermal expansion by the gas shower plate 43 of this embodiment is concretely explained with reference to the accompanying drawings. In conjunction with this explanation, a schematic plan view of a conventional gas shower plate 543 having a structure that no cutout portions such as slits are formed is shown in FIG. 5A, and a schematic sectional view taken along the line A-A in the conventional gas shower plate 543 of FIG. 5A is shown in FIG. 5B. Also, a schematic plan view of the gas shower plate 43 with the slits S formed therein according to this embodiment of the present invention is shown in FIG. 6A, and a schematic sectional view taken along the line B-B in the gas shower plate 43 of FIG. 6A is shown in FIG. 6B.

First, as shown in FIGS. 5A and 5B, the gas shower plate 543 having a disc-like shape is supported at the entire lower surface of its annular outer peripheral edge portion by a protruding portion 545' of a support member 545, where the supported portion serves as a support region R1, which is an annular region (or an planar annular region), with which the lower surface of the gas shower plate 543 is covered without being exposed to the plasma generation space A. Meanwhile, inside this outer peripheral edge portion, the lower surface of the gas shower plate 543 is exposed to the plasma generation space A and serves as a gas passage region R2 that allows the plasma-generation use gas supplied to the gas supply port T to pass through within the gas shower plate 543 so as to be supplied to the plasma generation space A.

After the state of the plasma processing, with the plasma generation space A rapidly increased in temperature, first in the porous plate 543, its portion corresponding to the gas passage region R2 is rapidly increased in temperature. Meanwhile, the support region R1, which is a region surrounding the gas passage region R2 and which is covered with the protruding portion 545' without being exposed to the plasma generation space A, is more gently increased in temperature, compared with the gas passage region R2. Therefore, the portion corresponding to the gas passage region R2 becomes high in temperature while the portion corresponding to the support region R1 becomes relatively low in temperature, so that a large temperature difference (e.g., about 50° C.) occurs therebetween, resulting in a difference in the amount of thermal expansion. As a result of this, as shown in FIGS. 5A and 5B, radial stresses F1 directed from the gas passage region R2 of the porous plate 543 toward its surrounding support region R1 occur radially. Particularly in the support region R1, the stresses become a maximum at its outer peripheral edge portion, causing resultant stresses F2 to occur along the circumference of the porous plate. In such a situation, at the outer peripheral edge portion of the porous plate 543, cracks or the like are likely to occur due to the stresses F2 acting circumferentially.

Figure 6A:
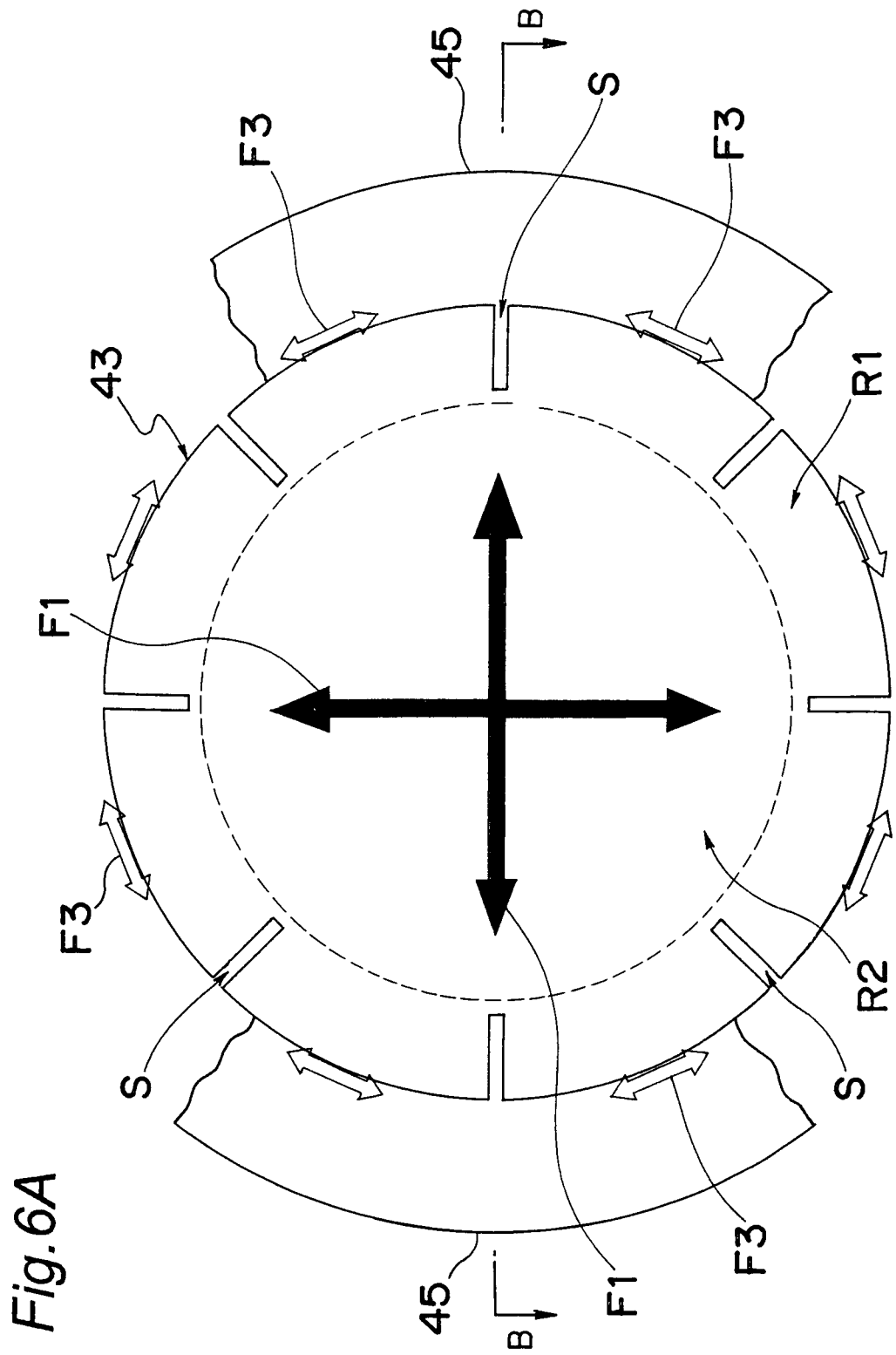
FIG. 6A is a schematic plan view of the gas shower plate according to the embodiment.

On the other hand, in the gas shower plate 43 of this embodiment shown in FIGS. 6A and 6B, in which a plurality of slits S are formed in the support region R1, even if radial stresses F1 act in the gas passage region R2 similarly, stresses (tensile stress) F3 occurring at the outer peripheral end portion of the support region R1 can be divided by intervals between the individual slits S, respectively, so that the stresses F3 can be reduced in magnitude thereof. That is, at the individual slits S, which are subjected to minute elastic deformation so as to be expanded in their gap distances, it becomes achievable to reduce the magnitude of the stresses F3.

For more effective obtainment of such a thermal expansion absorption function of the slits S, it is preferable that end portions of the slits S are positioned in the support region R1 so as to be close to its boundary with the gas passage region R2, i.e., the slits S are formed in the support region R1 so that the radial cut-in depth of the slits S becomes more deeper. By such formation of the slits S, the amount of elastic deformation attributed to their shape can be increased, and the suppression effect for the stresses caused by thermal expansion can be further improved.

The embodiment shown above has been described on a case where the slits S are formed as an example of the cutout portions in the gas shower plate 43. However, other various modification examples may be applied.

Figure 7:
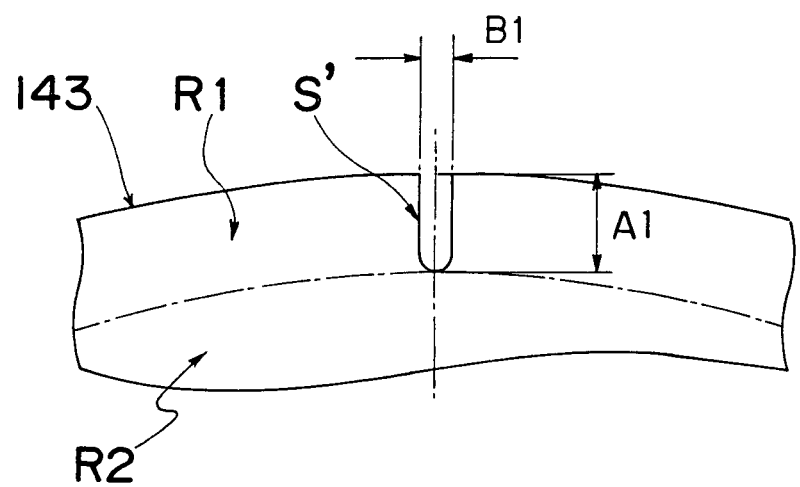
FIG. 7 is a partial schematic plan view showing a configuration of a slit of a gas shower plate according to a modification example of the embodiment.
Figure 8:
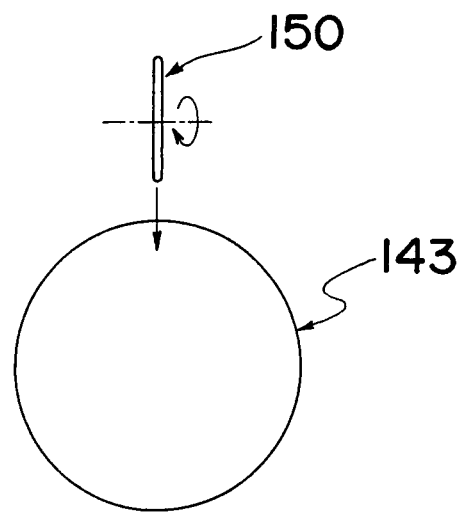
FIG. 8 is a schematic explanatory view for explaining the formation method for the slit of FIG. 7.

For instance, as shown in FIG. 7, which is a partly enlarged schematic plan view of an outer peripheral edge portion of a gas shower plate 143 of FIG. 7, roughly U-shaped slits S' may be formed. In the case of such a U-shaped slit S', since a central side inner circumferential surface of the gas shower plate 143 is formed of a curved surface, an effect of suppressing stress concentration can be obtained, so that occurrence of cracks or the like to the inner circumferential surface of the slit S' can be prevented. Such a slit S' can be formed by, for example, cutting process with the use of a disc-shaped cutting tool 150 having an outer peripheral end portion formed of a curved surface, as shown in the schematic explanatory view of FIG. 8. It is noted that the curved surface to be formed in such a slit S' is preferably formed into a gently curved surface from the viewpoint of suppressing stress concentration.

Figure 9:
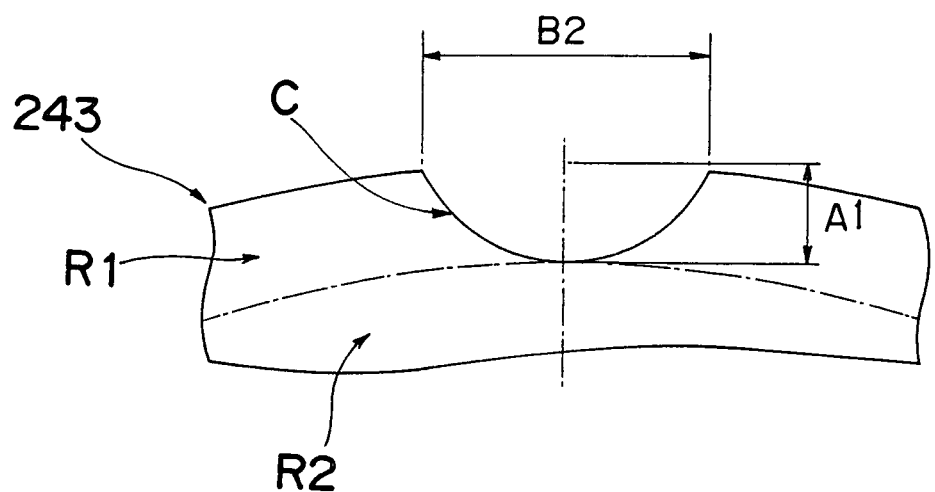
FIG. 9 is a partial schematic plan view showing a configuration of a cutout portion of a gas shower plate according to another modification example of the embodiment.
Figure 10:
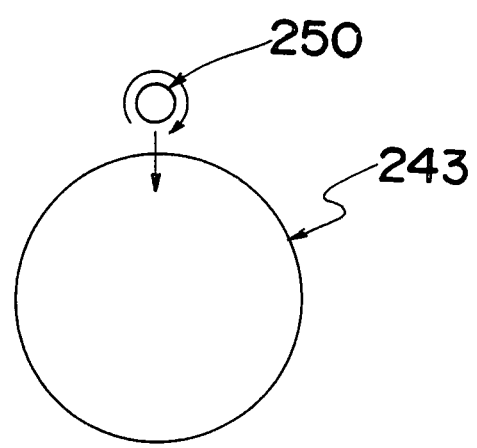
FIG. 10 is a schematic explanatory view for explaining the formation method for the cutout portion of FIG. 9.

Accordingly, for instance, a generally semicircular-shaped cutout portion C having an inner circumferential surface formed of a curved surface alone may be formed as shown in FIG. 9, which is a partly enlarged schematic plan view of an outer peripheral edge portion of a porous plate 243. This cutout portion C, although having a cut-in depth A1 in the radial direction of the porous plate equal to the cut-in depth A1 of the slit S' of FIG. 7, yet has an opening size B2, which is the circumferential width, formed larger than an opening size B1 of the slit S' because of the circumferential surface formed entirely of a curved surface. By the arrangement that the inner circumferential surface of the cutout portion C is formed of a curved surface alone (or formed of a curved surface in most part), it becomes possible to disperse the stresses to a greater extent, so that the occurrence of cracks or the like can be prevented more reliably. It is noted that such cutout portions C can be formed by, for example, a cutting process with the use of a bar-shaped cutting tool 250 having a circular-shaped cross section as shown in the schematic explanatory view of FIG. 10.

In the above-described individual aspects of this embodiment, the individual cutout portions (including slits) are preferably made identical in configuration and size and, besides, arranged at an equidistant pitch in order to more uniformly relax stresses that occurs at the outer peripheral edge portion of the gas shower plate.

However, from the viewpoints of the capacity occupied by the cutout portions and the strength sustainment for the gas shower plate, relatively large cutout portions and small cutout portions may be formed compositely in the outer peripheral edge portion of the gas shower plate (that is, mixed-arrangement of the large and small cutout portions may be applied). In such a case, it is preferable, from the viewpoint of the uniformity of stress relaxation, that the arrangement of the individual cutout portions is made symmetrical.

Also, in the above embodiment, other members may be arranged within the individual cutout portions of the gas shower plate unless elastic deformation of the cutout portions serving for the absorption of any strain due to thermal expansion is inhibited. Further, the inner circumferential surfaces of the cutout portions may be subjected to surface finishing or the like in order to suppress gas passage. With such an arrangement, the gas passage through the inner circumferential surfaces of the cutout portions in the gas shower plate may be suppressed.

According to the present invention, although strain occurs to the outer edge portion of the gas shower plate because of thermal expansion due to rapid temperature increases in the plasma processing, yet the strain is absorbed by the cutout portions, so that the gas shower plate can be prevented from being damaged due to occurrence of cracks at the outer edge portion or the like. Therefore, a stable plasma processing can be carried out, and the gas shower plate is useful as those of plasma processing apparatuses for use of, in particular, surface etching of wafer or the like.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2005-108330 filed on Apr. 5, 2005 including specification, drawing and claims are incorporated herein by reference in its entirety.

The invention claimed is:

1. A gas shower plate for use with a plasma processing apparatus, for feeding out a plasma-generation gas supplied from a gas supply portion to a plasma processing space defined between an upper electrode and a lower electrode of the plasma processing apparatus, the shower plate comprising:

a porous plate having gas permeability, which is formed of a sintered body of ceramic particles, the plate having a plurality of cutout portions which are formed in an outer edge portion of the plate so as to extend through the plate in a thicknesswise direction thereof and which serve for absorption of thermal expansion of the plate, wherein:

the porous plate has a disc-like shape, the plate having a support region which is an annular region located in an outer edge portion of the disc-like shape and on which the plate is supported by the plasma processing apparatus, and a gas passage region which is a circular region located inside the outer edge portion of the disc-like shape and surrounded by the support region and in which the plasma-generation gas is allowed to pass therethrough, each of the cutout portions is formed in the support region so as to be in close proximity to a boundary with the gas passage region, and the cutout portions are formed only in the outer edge portion of the plate, and the support region being a region that is unexposed to plasma generated in the plasma processing space.

2. The gas shower plate for use with the plasma processing apparatus as defined in claim 1, wherein the porous plate has a disc-like shape, and the individual cutout portions are formed at an equal pitch in an outer peripheral edge portion of the disk-like shape.

3. The gas shower plate for use with the plasma processing apparatus as defined in claim 2, wherein the cutout portions have identical sizes and shapes.

4. The gas shower plate for use with the plasma processing apparatus as defined in claim 1, wherein in each of the cutout portions, at least an inner circumferential surface on one side closer to a center of the porous plate is formed into a curved surface.

5. The gas shower plate for use with the plasma processing apparatus as defined in claim 4, wherein each of the cutout portions is formed so that an entirety of its inner circumferential surface becomes a curved surface.

6. The gas shower plate for use with the plasma processing apparatus as defined in claim 1, wherein each of the cutout portions has a slit-like shape.

* * * * *